United States Patent
Reddy et al.

(10) Patent No.: US 6,933,731 B2
(45) Date of Patent: Aug. 23, 2005

(54) METHOD AND SYSTEM FOR DETERMINING TRANSISTOR DEGRADATION MECHANISMS

(75) Inventors: Vijay Kumar Reddy, Plano, TX (US); Robert L. Pitts, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 115 days.

(21) Appl. No.: 10/687,796

(22) Filed: Oct. 17, 2003

(65) Prior Publication Data

US 2005/0086038 A1 Apr. 21, 2005

(51) Int. Cl.$^7$ .................. G01R 27/28; G01R 31/26; G06F 17/50; H01L 23/58; H01L 21/66
(52) U.S. Cl. .................. 324/612; 257/48; 331/44; 331/57; 438/17; 438/18; 703/13; 703/14; 703/15; 703/19
(58) Field of Search .................. 331/44, 57; 257/48; 324/612; 438/17, 18; 703/13–15, 19

(56) References Cited

U.S. PATENT DOCUMENTS

| | | | |
|---|---|---|---|
| 5,587,665 A | 12/1996 | Jiang | 326/16 |
| 6,024,478 A | 2/2000 | Yamamoto | 364/488 |
| 6,051,984 A | 4/2000 | Huang et al. | 324/765 |
| 6,216,099 B1 | 4/2001 | Fang et al. | 703/15 |
| 6,278,964 B1 | 8/2001 | Fang et al. | 703/19 |
| 6,321,364 B1 | 11/2001 | Hirata | 716/5 |
| 6,842,078 B2 * | 1/2005 | Manna et al. | 331/57 |

* cited by examiner

*Primary Examiner*—David Mis
(74) *Attorney, Agent, or Firm*—Yingsheng Tung; Wade James Brady, III; Frederick J. Telecky, Jr.

(57) ABSTRACT

According to one embodiment, a method for isolating degradation mechanisms in transistors includes providing a ring oscillator having a plurality of delay elements. Each delay element operates as a delay element through the use of one or more transistors of only a first type and no transistors of the opposite type. The method further includes operating the ring oscillator and measuring the frequency resulting from the ring oscillator over time. The magnitude of an isolated degradation mechanism is determined based on a comparison of the measured frequency and an expected frequency for the ring oscillator absent degradation.

20 Claims, 2 Drawing Sheets

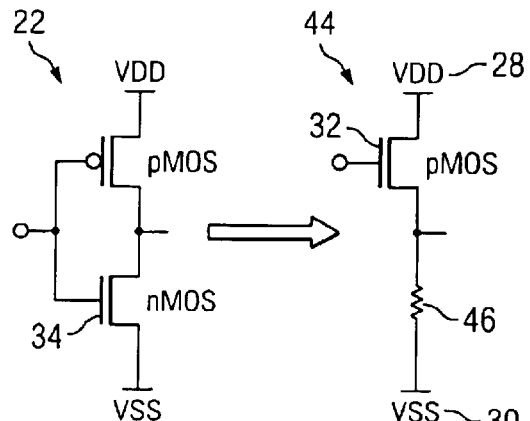
*FIG. 3A*
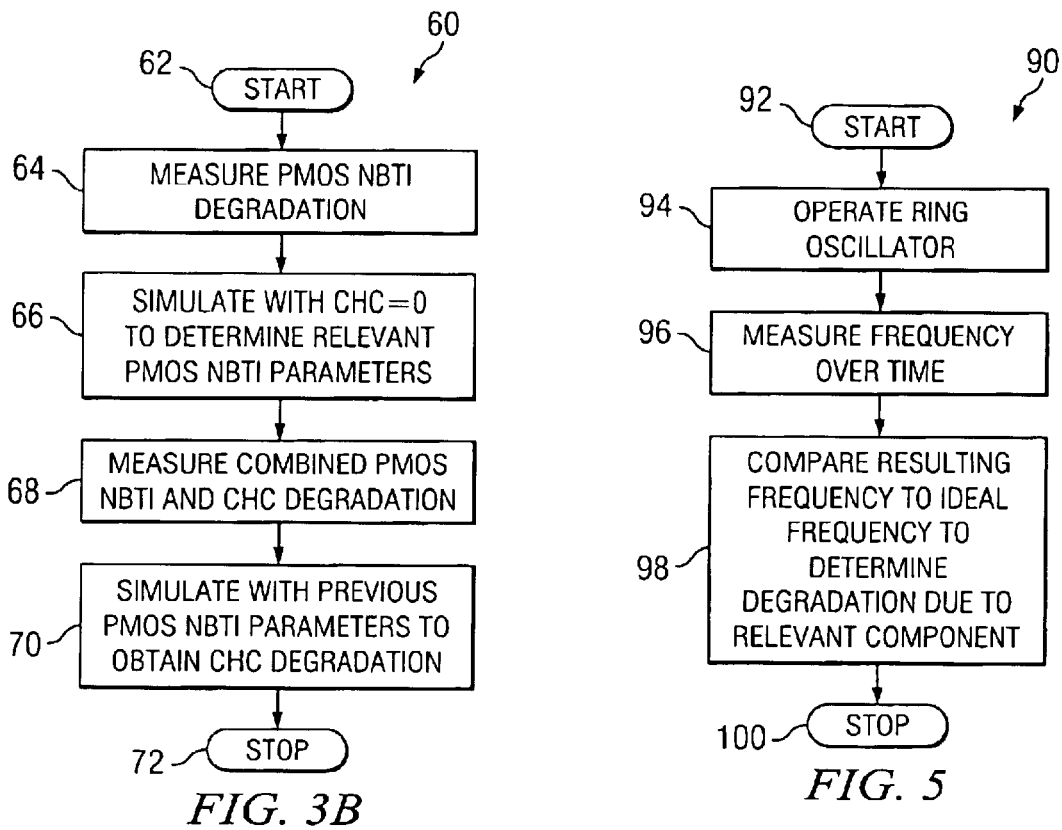
*FIG. 3B*
*FIG. 5*
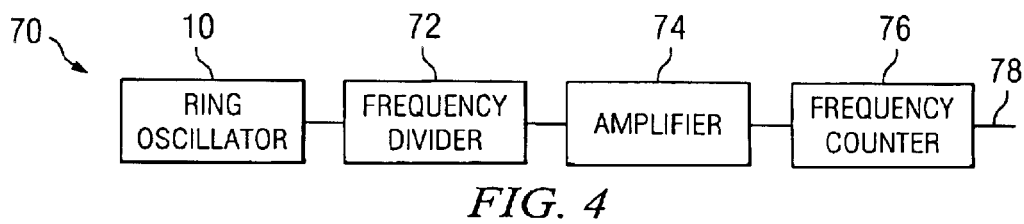
*FIG. 4*

METHOD AND SYSTEM FOR DETERMINING TRANSISTOR DEGRADATION MECHANISMS

TECHNICAL FIELD OF THE INVENTION

This invention relates generally to transistor degradation testing and more particularly to a method system for determining transistor degradation mechanisms.

BACKGROUND OF THE INVENTION

Transistors are pervasive in today's society. Transistors form the building blocks for almost all commercial semiconductor products. Through use, the operation of a transistor may degrade over time. There are currently several known modes of transistor degradation. One type of degradation mechanism involves channel hot carriers. In general a high electric field within a transistor causes degradation in the gate oxide. Another degradation mechanism is referred to as negative biased temperature instability degradation.

Current methods for measuring transistor degradation involves CMOS ring oscillators. In general, a ring oscillator formed from an odd plurality of CMOS inverters is operated at excess voltage levels and the frequency resulting from the oscillator is measured over time. As transistors within the CMOS inverters degrade, the frequency generated by the oscillator slows down. Thus the measured frequency of the oscillator provides a measure of the overall degradation of the transistors in the CMOS inverters.

A problem with this approach is that, although it provides an overall measure of the degradation within transistors, it does not allow an identification of the magnitude of contribution of the various constituent degradation mechanisms. Knowing the magnitude of each constituent degradation mechanism allows better modeling of transistor degradation.

SUMMARY OF THE INVENTION

According to one embodiment, a method for isolating degradation mechanisms in transistors includes providing a ring oscillator having a plurality of delay elements. Each delay element operates as a delay element through the use of one or more transistors of only a first type and no transistors of the opposite type. The method further includes operating the ring oscillator and measuring the frequency resulting from the ring oscillator over time. The magnitude of an isolated degradation mechanism is determined based on a comparison of the measured frequency and an expected frequency for the ring oscillator absent degradation.

Some embodiments of the invention provide numerous technical advantages. Some embodiments may benefit from some, none, or all of these advantages. According to one embodiment, a method and apparatus for isolating degradation mechanisms is provided that allows test personnel to determine a contribution to transistor degradation arising from various constituent components. In one example, channel hot carriers ("CHC") due to both PMOS transistors and NMOS transistors are identified, and at the same time, negative biased temperature instability ("NBTI") degradation, which affects only PMOS transistors, is determined. By determining the contribution of each degradation constituent, more accurate models may be developed to protect transistor degradation.

Other technical advantages may be readily ascertainable by one of skill in the art.

BRIEF DESCRIPTION OF THE DRAWINGS

For a more complete understanding of the invention, and for further features and advantages, reference is now made to the following description, taken in conjunction with the accompanying drawings, in which:

FIG. 3A is a set of circuit diagrams showing modification of a standard CMOS inverter to a converter utilizing no NMOS transistors to isolate only PMOS degradation;

FIG. 3B is a flowchart showing example steps associated with a method for isolating NBTI and CHC degradation contributions;

FIG. 4 is a block diagram showing a system for measuring transistor degradation according to the teachings of the invention; and FIG. 5 is a flowchart illustrating a method for measuring transistor degradation according to the teachings of the invention.

DETAILED DESCRIPTION OF THE INVENTION

Embodiments of the invention and its advantages are best understood by referring to FIGS. 1A through 4B of the drawings, like numerals being used for like and corresponding parts of the various drawings.

Figure 1A:
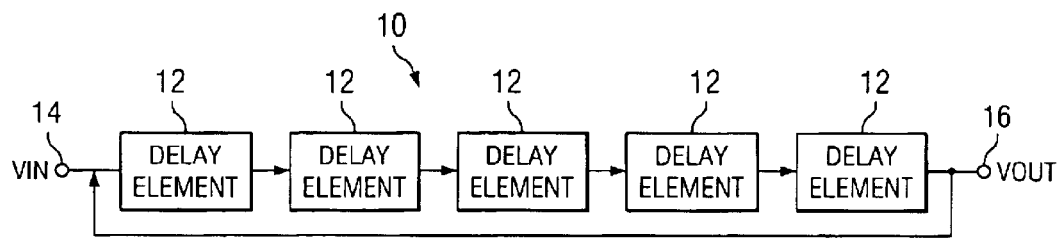
FIG. 1A is a block diagram of a ring oscillator according to the teachings of the invention.
Figure 1B:
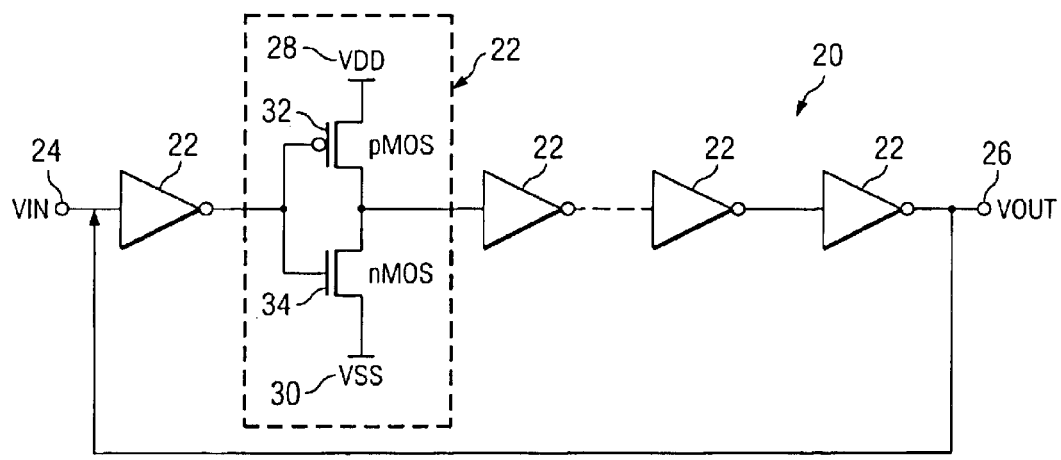
FIG. 1B is a block diagram showing details of one embodiment of the ring oscillator of FIG. 1A.

FIG. 1A is a ring oscillator 10 used to determine transistor degradation according to the teachings of the invention. Ring oscillator 10 includes a plurality of delay elements 12 and has a voltage input 14 and a voltage output 16. As illustrated in FIG. 1A each delay element receives as its input the output of a preceding delay element in ring oscillator 10. As used herein, because oscillator 10 is in a ring topology, the delay element on the right of FIG. 1 is considered to precede the delay element on the left of FIG. 1. Delay elements 12 may take the form of any logical element that produces some propagation delay. A particular example of a delay element 12 is an inverter, described in greater detail in FIG. 1B. Conventionally, an odd number of delay elements 12 are arranged to produce an output voltage node 16 that oscillates over time, and delay elements 12 are formed from both PMOS and NMOS transistors. Due to degradation in both the PMOS and NMOS transistors that make up delay elements 12, the frequency of oscillation at output node 16 reduces over time. The reduction in oscillation frequency is an indication of the magnitude of degradation within the transistors making up delay element 12.

The teachings of the invention recognize that constituent components of transistor degradation vary between PMOS and NMOS transistors and that the various constituent components may be isolated by utilizing delay elements that utilize only one of the types of the transistors and not the other. For example, in the case in which delay element 12 is an inverter including a PMOS an NMOS transistor connected in series, the PMOS transistor could be replaced with either an NMOS transistor or a resistor in an appropriate configuration such that delay element 12 still acts as an inverter, but such that there is no degradation due to a PMOS transistor. The teachings of the invention recognize that without the presence of PMOS transistors, the only degradation mechanism is NMOS CHC degradation because NMOS transistors do not exhibit NBTI degradation. Conversely, delay element 12 could be formed utilizing no NMOS transistors to remove any NMOS CHC degradation leaving only PMOS NBTI or CHC degradation. Additional analysis could then be used to isolate PMOS NBTI degradation from PMOS CHC degradation, as described in greater detail below.

Thus, by forming delay elements from an appropriate use of transistors of only one type (and/or appropriate passive elements), degradation contribution from the other types of transistor may be removed from the test procedure, allowing isolation of the desired constituent degradation component.

FIG. 1B is a circuit diagram illustrating one particular embodiment of ring oscillator 10. In this embodiment, ring oscillator 20 includes a plurality of inverters 22. One inverter 22 is illustrated in detail, showing the transistors that form the inverter 22. As illustrated, each inverter 22 includes a PMOS transistor 32 and an NMOS transistor 34 connected in a series. The drain of PMOS transistor 32 is connected to a voltage supply Vdd 28 and the source of NMOS transistor 34 is connected to voltage supply Vss 30. The gates of transistors 32 and 34 are coupled and are controlled by the output of the preceding inverter 22. As described above in conjunction with FIG. 1A, such an oscillator is often used to measure the degradation of transistors over time, and allows a determination of the total degradation, but not the constituent CHC and NBTI components. Inverters 22 are often referred to as CMOS inverters. According to certain embodiments of the invention, inverters 22 are modified to be formed from either two PMOS transistors, two NMOS transistors, or one PMOS transistor with a resistor, or one NMOS transistor with a resistor. Doing so allows isolation of the various constituent degradation components which is desirable to result in a more accurate degradation model. Additional details of example embodiments of such inverters are described in greater detail in conjunction with FIGS. 2A through 3B.

Figure 2A:
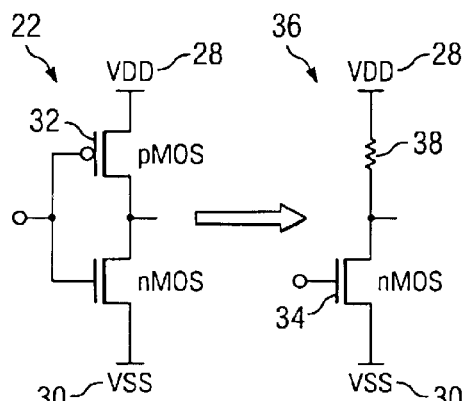
FIG. 2A is a set of circuit diagrams illustrating a modification of a standard CMOS inverter to an inverter utilizing no PMOS transistors in order to isolate NMOS CHC degradation.

FIG. 2A shows a pair of circuit diagrams showing conversion of inverter 22 to an inverter 36 that allows isolation of NMOS CHC degradation. In general, PMOS transistor 32 is removed so that there are no PMOS transistors in inverter 36. By removing the PMOS transistor, no PMOS NBTI or CHC degradation may occur. Thus, the only degradation mechanism is NMOS CHC degradation. In this example, PMOS transistor 32 is replaced with a resistor 38 in series between voltage supply 28 and the drain of NMOS transistor 34. In this embodiment, the output of a preceding inverter 22 is received at the gate of NMOS transistor 34 only. Thus, inverter 36 acts as an inverter but does not result in any PMOS NBTI or CHC degradation, allowing isolation of NMOS CHC degradation.

Figure 2B:
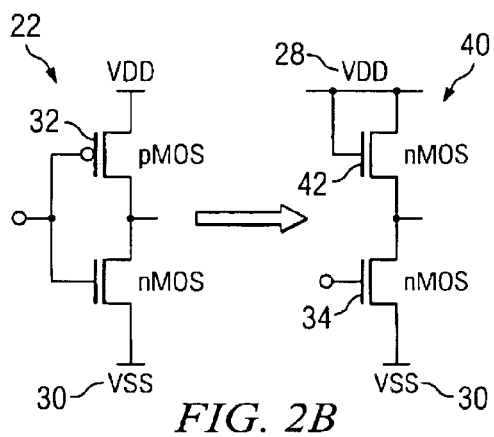
FIG. 2B is a set of circuit diagrams showing modification of a standard CMOS inverter to a second embodiment of an inverter using no PMOS transistors to isolate NMOS CHC degradation.

An alternative inverter 40 that also isolates NMOS CHC degradation, having no PMOS NBTI or CHC degradation, is illustrated in FIG. 2B. In FIG. 2B inverter 40 includes two NMOS transistors 42 and 34 connected in a series with the gate of NMOS transistor 34 receiving an output of the previous inverter in the ring. NMOS transistor 42 has both its drain and gate tied to power supply 28. Again, by removing all PMOS transistors from inverter 40, no PMOS NBTI/or CHC degradation is possible, resulting in isolation of NMOS CHC degradation. Other suitable circuit configurations could also be used that do not involve PMOS transistors. It is noted that NMOS transistors do not result in NBTI degradation and therefore removal of PMOS transistors from the delay elements (in this example inverters) results in only NMOS CHC degradation and no NBTI degradation (or PMOS CHC degradation).

FIG. 3A shows an example modification of inverter 22 that removes NMOS CHC degradation and leaves only PMOS NBTI and CHC degradation. This is accomplished by removing NMOS transistors from inverter 22, resulting in inverter 44. NMOS transistor 34 is replaced with a resistor 46 and coupled in series with PMOS transistor 32 as illustrated in FIG. 3A. One end of resistor 46 is coupled to voltage supply 30 and the other end is coupled to the source of PMOS transistor 32. PMOS transistor 32 has its gate coupled to the output of a preceding inverter 22 in the ring. The resulting inverter 22, having no NMOS transistors, exhibits no NMOS CHC degradation, but only PMOS NBTI or CHC degradation. Thus, a ring oscillator formed from inverters 44 may be used to isolate such degradation mechanisms. Methods for further isolating PMOS CHC from degradation from PMOS NBTI degradation are described in greater detail below in conjunction with FIG. 3B.

FIG. 3B illustrates a method for further isolating PMOS NBTI degradation from PMOS CHC degradation. The teachings of the invention recognize that PMOS transistors having a long channel length will exhibit only NBTI degradation. CHC degradation does not occur in long channel PMOS transistors. As used herein, long channel length refers to channel lengths greater than approximately 1 micron. However, PMOS transistors with smaller channel lengths, such as 0.1 microns or less, will exhibit both PMOS CHC and NBTI degradation. Although the teachings of the invention may be utilized with variety of sizes of transistors, particular embodiments are particularly suited to measuring and predicting degradation of transistors having a channel length of less than about 0.1 microns. According to the teachings of the invention, delay elements (inverters in this example) having no NMOS transistors are first utilized to remove NMOS CHC degradation. Then two different circuits having delay elements formed from only PMOS transistors are operated. One such circuit utilizes PMOS transistors having a long channel and the other circuit utilizes PMOS transistors that have a short channel. This allows isolation of the two PMOS modes of degradation from each other.

In particular, one embodiment of the method involves first determining NBTI PMOS degradation through the use of a ring oscillator formed from delay elements having long channels. As described above long channel PMOS transistors exhibit only NBTI degradation. Once the NBTI degradation component is determined, this information may be compared to total degradation arising from ring oscillators operating with delay elements having short channel PMOS transistors. The difference in degradation contributions is the PMOS CHC degradation. However the difference is not necessarily an algebraic difference. According to the teachings of the invention, the NBTI degradation component obtained from the long channel transistors is matched to a computer simulation to determine parameters with appropriately model the modes of degradation. One example of such a program that is suitable for this purpose is HOTRON, developed at Texas Instruments. Another suitable simulator that is commercially available is Relxpert. Then, measurements obtained from a ring oscillator using inverters having short channel PMOS transistors are matched to a simulation of that circuit utilizing the NBTI parameters previously obtained. The CHC parameters are varied until the simulation matches the measured frequency response of the measurement. The resulting CHC parameters provide the PMOS CHC degradation.

One example of this procedure is further detailed in the flowchart of FIG. 3B. The method 60 for isolating PMOS NBTI degradation from PMOS CHC degradation begins at step 62. At step 64 the PMOS NBTI degradation is isolated by operating a ring oscillator utilizing delay elements (inverters in this example) formed from long channel only transistors. Because PMOS CHC degradation is not exhibited in long channel transistors, this allows isolation of PMOS NBTI degradation. The CHC component of the PMOS degradation is not, however, simply an algebraic difference between the PMOS degradation and the NBTI degradation. Thus simulation is utilized to determine the PMOS CHC degradation component. At step 66, the system measured at 64 is simulated to determine the suitable simulation PMOS NBTI parameters that accurately predict the measured PMOS NBTI degradation measured at step 64. Programs for performing such simulation are available and include HOTRON and Relxpert, described above. The result of step 66 are one or more parameters that may be used in the simulation to represent the amount of PMOS NBTI degradation.

At step 68, operation of a ring oscillator formed from delay elements having short channel only transistors is measured. The resulting measured degradation includes NBTI and CHC components. This combined degradation is then utilized at step 70. At step 70, the oscillator measured at step 68 is simulated with the parameters determined at step 66 indicative of the contribution of PMOS NBTI degradation. The relevant CHC parameters are varied in the simulation until the simulated operation of the ring operator at step 70 matches the measured operation at step 68. The resulting simulation parameters indicate the CHC degradation component. The method concludes at step 62.

Thus, method 60 allows further isolation of PMOS NBTI degradation from PMOS CHC degradation, resulting in more accurate models for predicting transistor degradation.

FIG. 4 is an example system for measuring the operation of ring oscillators such as ring oscillator 10 according to the teachings of the invention. System 70 may be used in conjunction with method 60 of FIG. 3B to further isolate NBTI PMOS degradation from CHC PMOS degradation, as well as to isolate PMOS contributions from NMOS contributions. System 70 includes, in this embodiment, ring oscillator 10, a frequency divider 72, an amplifier 74 and a frequency counter 76. The output of system 70 is provided at node 78. Ring oscillator 10 may be any suitable ring oscillator formed from delay elements having appropriate transistors or passive devices that allow isolation of appropriate components of degradation, as described above. The output of ring oscillator is provided in some embodiments to frequency divider 72 because, due to the size of transistors involved, the resulting frequencies of ring oscillators are often quite high. The high frequencies are more readily measured if they are reduced by a frequency divider. In some embodiments the output of frequency divider 72 is amplified by an amplifier 74 and provided to a frequency counter 76. Frequency counter 76 generates an output indicative of the frequency of operation of ring oscillator 10. System 70 therefore allows measurement of the frequency of operation of ring oscillator over time and, as described above, therefore allows measurement of various degradation components.

FIG. 5 is a flowchart illustrating a method 90 for determining a degradation component of a transistor that may be utilized with the system of FIG. 4, or other suitable systems. The method 90 begins at step 92. At step 94 an appropriate ring oscillator is operated. The ring oscillator is formed from delay elements which are in turn formed from transistors and (in some case passive elements) do not include transistors of the opposite type, as described above. As used and herein, a PMOS transistor is of an opposite type of an NMOS transistor and an NMOS transistor is an opposite type of a PMOS transistor. At step 96 the frequency of operation of the ring oscillator over time is measured. At the step 98 this frequency of operation is compared to the actual frequency levels that would occur after degradation to determine the relevant degradation component. The actual frequency of oscillation may be determined through simulation. The method concludes at step 100. Thus, according to the teachings of the invention, various PMOS and NMOS CHC and NBTI degradation components may be isolated, allowing for precise predictions of transistor reliability.

Although the present invention has been described in detail, it should be understood that the various changes, substitutions, and alterations can be made hereto without departing from the spirit and scope of the invention as defined by the appended claim.

What is claimed is:

1. A method for isolating degradation mechanisms in transistors comprising:
   providing a ring oscillator having a plurality of delay elements, each delay element operating as a delay element through the use of one or more transistors of only a first type and no transistors of the opposite type;
   operating the ring oscillator and measuring the frequency resulting from the oscillator over time; and
   determining the magnitude of an isolated degradation mechanism based on a comparison of the measured frequency and an expected frequency for the ring oscillator absent degradation.

2. The method of claim 1, wherein the first type is an NMOS transistor and the isolated degradation mechanism is NMOS CHC degradation.

3. The method of claim 1, wherein the first type is a PMOS transistor and the isolated degradation mechanism is PMOS degradation.

4. The method of claim 1, wherein the delay elements each comprise an inverter formed from a resister in series with an NMOS transistor and the gate at the NMOS transistor is coupled to an output of a preceding delay element in the ring oscillator.

5. The method of claim 1, wherein the delay elements each comprise an inverter formed from first and second NMOS transistors connected together in series with the gate of the first transistor coupled to the drain of the first transistor and the gate of the second transistor coupled to an output of a preceding delay element in the ring oscillator.

6. The method of claim 1, wherein the delay elements each comprise an inverter formed from a resister in series with a PMOS transistor and the gate of the PMOS transistor is coupled to an output of a preceding delay element in the ring oscillator.

7. The method of claim 2, wherein each of the delay elements is an inverter.

8. The method of claim 3, wherein each of the delay elements is an inverter.

9. The method of claim 3, wherein the one or more transistors each comprise gates greater than or equal to one micron in length.

10. The method of claim 3, where the one or more transistors each comprise gates less than or equal to 0.1 microns in length.

11. A method of isolating degradation mechanisms in transistors comprising:

providing first and second ring oscillators each having a plurality of delay elements, each delay element operating as a delay element through the use of one or more PMOS transistors and no NMOS transistors, the PMOS transistors in the first ring oscillator having a gate length greater than or equal to about one micron and the PMOS transistors in the second ring oscillator having a gate length of less than or equal to about 0.1 microns;

operating the first and second ring oscillators and measuring their respective frequencies resulting from the respective oscillators over time;

determining, based on simulation of the first ring oscillator and the measured frequency over time of the first ring oscillator, a degradation component associated with NBTI PMOS degradation;

using the determined NBTI PMOS degradation, modeling the operation of the second ring oscillator to match the measured frequency over time characteristics of the second ring oscillator; and based on the model of the second ring oscillator, determining a degradation component associated with CHC PMOS degradation.

12. The method of claim 11, wherein the delay elements in each of the ring oscillators each comprise inverters.

13. The method of claim 12, wherein the inverters in each of the ring oscillators each comprise a PMOS transistor connected in series with a resister and having a gate connected to an output of a preceding inverter in the respective ring oscillator.

14. The method of claim 11, wherein modeling the operation of the second ring oscillator comprises modeling the second ring oscillator with the HOTRON software program.

15. A system for determining degradation components in a transistor comprising:

a ring oscillator comprising a plurality of delay elements each comprising at least one transistor for which the degradation component is described and having a gate length of less than or equal to about 0.1 microns;

a frequency counter operable to measure the frequency of the ring oscillator over time; and wherein each of the delay elements comprises no transistors of a type opposite to the type of the at least one transistor.

16. The system of claim 15, and wherein the at least one transistor is an PMOS transistor.

17. The system of claim 15, and wherein the at least one transistor is an NMOS transistor.

18. The system of claim 15, wherein each delay element is an inverter.

19. The system of claim 18, wherein each delay element comprises a resistor in series with the at least one transistor and wherein the at least one transistor comprises a gate connected to an output of a preceding inverter in the ring oscillator.

20. The system of claim 18, wherein the at least one transistor comprises first and second transistors connected in series, the first transistor having a gate connected to an output of a preceding inverter in the ring oscillator and the second transistor having a drain and a gate coupled together.

* * * * *